United States Patent
He et al.

(10) Patent No.: US 12,439,691 B2
(45) Date of Patent: Oct. 7, 2025

(54) ARRAY SUBSTRATE AND DISPLAY APPARATUS COMPRISING OXIDIZATION PROTECTIVE LAYER ON COPPER CONDUCTIVE LAYER

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN); Feifei Li, Beijing (CN); Liping Lei, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/786,177

(22) PCT Filed: Aug. 26, 2021

(86) PCT No.: PCT/CN2021/114713
§ 371 (c)(1),
(2) Date: Jun. 16, 2022

(87) PCT Pub. No.: WO2023/024011
PCT Pub. Date: Mar. 2, 2023

(65) Prior Publication Data
US 2024/0186330 A1 Jun. 6, 2024

(51) Int. Cl.
*H10D 86/60* (2025.01)
*H10D 86/40* (2025.01)

(52) U.S. Cl.
CPC .......... *H10D 86/60* (2025.01); *H10D 86/441* (2025.01)

(58) Field of Classification Search
None
See application file for complete search history.

(56) References Cited

U.S. PATENT DOCUMENTS

| 2007/0205520 A1* | 9/2007 | Chou | H01L 24/12 257/E23.129 |
|---|---|---|---|
| 2016/0343739 A1* | 11/2016 | Liu | H01L 29/66969 |
| 2022/0302418 A1 | 9/2022 | Liu et al. | |

FOREIGN PATENT DOCUMENTS

| CN | 103943639 A | 7/2014 |
|---|---|---|
| CN | 104867985 A | 8/2015 |
| CN | 211554588 U | 9/2020 |
| CN | 211743124 U | 10/2020 |
| CN | 211743193 U | 10/2020 |
| CN | 212010934 U | 11/2020 |

* cited by examiner

*Primary Examiner* — Daniel Whalen
(74) *Attorney, Agent, or Firm* — IPro, PLLC

(57) ABSTRACT

Embodiments of the present disclosure provide an array substrate and a display apparatus. The array substrate includes: a base substrate; a conductive layer located on the base substrate, where a material of the conductive layer includes copper; and an oxidization protective layer, located on a side, facing away from the base substrate, of the conductive layer; where a material of the oxidization protective layer includes tungsten.

13 Claims, 3 Drawing Sheets

ARRAY SUBSTRATE AND DISPLAY APPARATUS COMPRISING OXIDIZATION PROTECTIVE LAYER ON COPPER CONDUCTIVE LAYER

CROSS REFERENCE TO RELATED APPLICATIONS

The present disclosure is a US National Stage of International Application No. PCT/CN2021/114713, filed on Aug. 26, 2021, the entire content of which is incorporated herein by reference.

FIELD

The present disclosure relates to the field of displaying, in particular to an array substrate and a display apparatus.

BACKGROUND

Copper, as a metal material with low electrical resistivity, has already been main routing wire metal in the semiconductor industry, but due to its property of being susceptible to oxidization, it will lead to instable properties of a product and reduce reliability of the product.

SUMMARY

An array substrate provided by an embodiment of the present disclosure includes:
a base substrate;
a conductive layer, located on the base substrate, where a material of the conductive layer includes copper; and
an oxidization protective layer, located on a side, facing away from the base substrate, of the conductive layer; where a material of the oxidization protective layer includes tungsten.

Optionally, in the above array substrate provided by the embodiment of the present disclosure, the material of the oxidization protective layer further includes nickel.

Optionally, in the above array substrate provided by the embodiment of the present disclosure, the material of the oxidization protective layer further includes copper.

Optionally, in the above array substrate provided by the embodiment of the present disclosure, the material of the oxidization protective layer further includes at least one type of other metal materials of which a lattice constant has a difference between 0.1 and 0.6 from a lattice constant of the copper.

Optionally, in the above array substrate provided by the embodiment of the present disclosure, a crystal form of each of the other metal materials is face-centered cubic or body-centered cubic, and a thermal diffusivity of each of the other metal materials is greater than a thermal diffusivity of the copper.

Optionally, in the above array substrate provided by the embodiment of the present disclosure, the other metal materials include titanium, molybdenum or aluminum.

Optionally, in the above array substrate provided by the embodiment of the present disclosure, a thickness of the oxidization protective layer ranges from 30 nm to 150 nm.

Optionally, in the above array substrate provided by the embodiment of the present disclosure, the base substrate includes a functional region, the functional region includes a plurality of first pads located on the base substrate, the plurality of first pads are configured to be bonded with a plurality of light-emitting units; the conductive layer includes an exposed surface region and a non-exposed surface region, and the exposed surface region in the conductive layer is the first pads.

Optionally, in the above array substrate provided by the embodiment of the present disclosure, the base substrate further includes a bonding region, the bonding region includes a plurality of second pads located on the base substrate, the plurality of second pads are configured to be bonded with a circuit board, the second pads and the conductive layer are located on the same film layer, and the oxidization protective layer is arranged on a side, facing away from the base substrate, of the second pads.

Optionally, the above array substrate provided by the embodiment of the present disclosure further includes a first routing wire layer located between the first pads and the base substrate; the first routing wire layer includes a first metal layer, a first routing wire sub-layer and a second metal layer which are arranged in a stacked mode; the first pads are electrically connected with the second metal layer, and the second pads are electrically connected with the second metal layer; and materials of the first metal layer and the second metal layer include a molybdenum-niobium alloy, and a material of the first routing wire sub-layer includes copper.

Optionally, in the above array substrate provided by the embodiment of the present disclosure, the functional region further includes: a first passivation layer located between the first routing wire layer and the first pads, a first flat layer located between the first passivation layer and the first pads, a second flat layer located on a side, facing away from the base substrate, of the oxidization protective layer, and a first connection portion located on the oxidization protective layer; where the second flat layer covers a region among the plurality of first pads.

Optionally, in the above array substrate provided by the embodiment of the present disclosure, the bonding region further includes: a second passivation layer located between the first routing wire layer and the second pads, a third flat layer located between the second passivation layer and the second pads, a fourth flat layer located on a side, facing away from the base substrate, of the oxidization protective layer, and a second connection portion located on the oxidization protective layer; where the fourth flat layer covers a region among the plurality of second pads; and the third flat layer and the first flat layer are arranged on the same layer, the fourth flat layer and the second flat layer are arranged on the same layer, and the second passivation layer and the first passivation layer are arranged on the same layer.

Optionally, in the above array substrate provided by the embodiment of the present disclosure, the plurality of first pads are divided into a plurality of first pad groups, and each first pad group includes a cathode pad and an anode pad which are arranged pairwise; and
the non-exposed surface region in the conductive layer is configured to realize series connection or parallel connection of the plurality of first pad groups and further configured to be electrically connected with the first routing wire layer through a via hole penetrating through the first flat layer and the first passivation layer.

Optionally, the above array substrate provided by the embodiment of the present disclosure further includes a protective layer located on a side, facing away from the base substrate, of the first pads and the second pads, the protective layer is exposed out of the first pads and the second pads, and a material of the protective layer includes silicon nitride or silicon oxide.

Optionally, in the above array substrate provided by the embodiment of the present disclosure, the base substrate includes a functional region, the functional region includes a thin-film transistor located on the base substrate, the thin-film transistor includes a source-drain electrode layer, and the source-drain electrode layer and the conductive layer are arranged on the same layer and made of the same material.

Correspondingly, an embodiment of the present disclosure further provides a display apparatus, including any array substrate above provided by an embodiment of the present disclosure.

BRIEF DESCRIPTION OF THE DRAWINGS

In order to describe the technical solutions in the embodiments of the present disclosure more clearly, accompanying drawings needed in the description of the embodiments will be briefly introduced below. Apparently, the accompanying drawings in the following description are only some embodiments of the present disclosure, and those ordinarily skilled in the art can obtain other drawings according to these drawings without creative work.

DETAILED DESCRIPTION OF THE EMBODIMENTS

Figure 1:
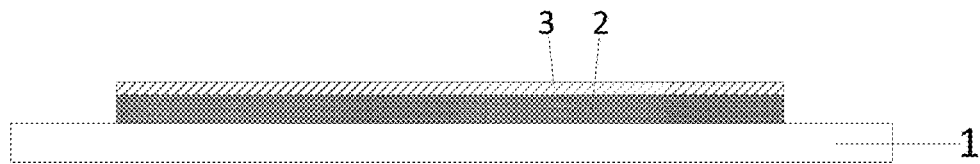
FIG. 1 is a schematic structural diagram of an array substrate provided by an embodiment of the present disclosure.

In order to make objectives, technical solutions and advantages of the embodiments of the present disclosure clearer, the technical solutions of the embodiments of the present disclosure will be described clearly and completely below with reference to the accompanying drawings of the embodiments of the present disclosure. Apparently, the described embodiments are some but not all of the embodiments of the present disclosure. The embodiments and features in the embodiments in the present disclosure may be mutually combined without a conflict. Based on the described embodiments of the present disclosure, all other embodiments obtained by those ordinarily skilled in the art without creative work fall within the protection scope of the present disclosure.

Unless other defined, technical or scientific terms used in the present disclosure should be commonly understood by those ordinarily skilled in the art to which the present disclosure belongs. "First", "second" and the similar words used in the present disclosure do not represent any sequence, quantity or significance but are only used for distinguishing different components. "Include", "contain" or similar words means that an element or an item preceding the word covers elements or items and their equivalents listed after the word without excluding other elements or items. "Connection", "connected" or similar words may include an electrical connection, direct or indirect, but is not limited to a physical or mechanical connection.

It needs to be noted that a size and a shape of each figure in the drawings do not reflect a true scale but only intend to illustrate contents of the present disclosure. The same or similar reference number represents the same element or a similar element or an element with the same function or a similar function all the time.

An embodiment of the present disclosure provides an array substrate. The array substrate may be configured to display or provide backlight, as shown in FIG. 1, including:
- a base substrate 1;
- a conductive layer 2, located on the base substrate 1, wherein a material of the conductive layer 2 includes copper (Cu); and
- an oxidization protective layer 3, located on a side, facing away from the base substrate 1, of the conductive layer 2; wherein a material of the oxidization protective layer 3 includes tungsten (W).

In the above array substrate provided by the embodiment of the present disclosure, after preparation of the conductive layer with the Cu material is completed, the oxidization protective layer of which a material includes tungsten (W) is prepared on the conductive layer, W has an oxidization resistance, and thus an effect of preventing a surface of the conductive layer from being oxidized is realized. Film forming of the oxidization protective layer 3 may be realized in a mode of target material sputtering, so as to obtain the oxidization protective layer 3 with high film forming uniformity, namely, high flatness of a surface of the film layer. Moreover, because a thermal diffusivity of W is greater than a thermal diffusivity of Cu, in a subsequent higher-temperature process, W in the oxidization protective layer may be diffused towards the conductive layer to form a W/Cu interface. Surface flatness of the oxidization protective layer 3 is high, uniformity of the formed W/Cu interface is good, and thus strong adhesion can be realized between the oxidization protective layer and the conductive layer. Therefore, the array substrate provided by the embodiment of the present disclosure can improve conductive stability of the conductive layer and improve the adhesion of the oxidization protective layer and the conductive layer, so as to improve reliability of a product.

During specific implementation, W in the oxidization protective layer is diffused towards the conductive layer, and Cu in the conductive layer may also be diffused towards the oxidization protective layer, but a diffusion rate of the former is higher than a diffusion rate of the latter. If Cu is added into the oxidization protective layer, Cu in the oxidization protective layer may induce Cu in the conductive layer to be diffused towards the oxidization protective layer, and forming of the W/Cu interface is accelerated, so that in the above array substrate provided by the embodiment of the present disclosure, the material of the oxidization protective layer further includes copper.

Several metals of which lattice constants are close form an alloy, which may be obtained in an alloy target material sputtering mode, or may be obtained in a single-metal target material co-sputtering mode. Film forming in the sputtering mode can guarantee film forming uniformity. On the basis of guaranteeing film forming uniformity of the oxidization protective layer, the material of the oxidization protective layer may include other metal materials with high oxidization resistance, and thus oxidization resistance of the oxidization protective layer is further improved. In the above array substrate provided by the embodiment of the present disclosure, the material of the oxidization protective layer may further include nickel. An oxidization resistance of the nickel (Ni) is high; and a lattice constant of Ni is 3.524 Å, which is close to the lattice constant (3.160 Å) of W and the lattice constant (3.615 Å) of Cu, so that the material of the oxidization protective layer includes the tungsten (W) and the nickel (Ni) at the same time. So the material of the oxidization protective layer adopts an alloy, and film forming uniformity of the oxidization protective layer may be improved. The thermal diffusivity of W is greater than a thermal diffusivity of Ni, in the subsequent higher-temperature process, W may also be diffused towards Ni, and thus adhesion in the film layer is further improved.

During specific implementation, an appropriate alloy material is selected, not only is stability of a thin film improved, but also adhesion of the thin film is improved, for example, the oxidization protective layer may be a binary alloy, or may be a ternary alloy or a multielement alloy. But a lattice constant of a selected metal material needs to match the lattice constant of the Cu material of the conductive layer, to improve whole adaptability of the alloy material. Thus in the above array substrate provided by the embodiment of the present disclosure, as shown in FIG. 1, the material of the oxidization protective layer 3 may further include at least one type of other metal materials of which a lattice constant has a difference between 0.1 and 0.6 from the lattice constant of the copper, specifically, a crystal form of each of the other metal materials is face-centered cubic or body-centered cubic. In this way, lattices between all metals match, a bonding force between the materials is improved, and a thermal diffusivity of each of the other metal materials is greater than a thermal diffusivity of the copper, so that on the basis of realizing oxidization resistance, the adhesion between the oxidization protective layer and the conductive layer is enhanced. Specifically, the other metal materials may include titanium (Ti), molybdenum (Mo) or aluminum (Al).

During specific implementation, in the above array substrate provided by the embodiment of the present disclosure, when the material of the oxidization protective layer 3 includes only W and Ni, a mass proportion of W is 25% to 50%, a mass proportion of Ni is 25% to 75%, and a mass proportion of each of other impurities, for example, Fe and C, is in a range of 0.01% to 0.1%. When the material of the oxidization protective layer 3 further includes Cu, Ti, Mo and other metals on the basis of including W and Ni, the mass proportions of W and Ni may be reduced properly.

During specific implementation, in the above array substrate provided by the embodiment of the present disclosure, as shown in FIG. 1, the oxidization protective layer 3 plays a main role in protecting the conductive layer 2, so the oxidization protective layer 3 cannot be too thick, to avoid the situation that etching difficulty is increased and a pattern shape cannot be guaranteed; and the oxidization protective layer 3 cannot be too thin, otherwise, the oxidization resistance is poor. Therefore, by comprehensively considering two factors of process implementation and oxidization resistance, in the embodiment of the present disclosure, a thickness of the oxidization protective layer 3 is set to range from 30 nm to 150 nm, for example, 30 nm, 40 nm, 50 nm, 60 nm, 70 nm, 80 nm, 90 nm, 100 nm, 110 nm, 120 nm, 130 nm, 140 nm, 150 nm, etc.

Specifically, the oxidization protective layer 3 may be obtained in an alloy target material sputtering mode, and may also be obtained in a single-metal target material co-sputtering mode, which may be selected according to actual demands.

Specifically, a material of the base substrate may be a rigid material, for example, glass, quartz, plastics; or a material of the base substrate may also be a flexible material, for example, polyimide, polymethyl methacrylate, polyethylene naphthalate, etc.

A Mini-LED (submillimeter light-emitting diode) refers to a light-emitting diode with a size between 80 μm and 300 μm. When the Mini-LED serves as a pixel of a display panel to constitute a self-luminous display, the higher pixel density can be realized compared with a small-spacing LED display. When the Mini-LED serves as a light source to be applied to a backlight module, an ultra-thin light source module may be fabricated through more dense light source distribution; and in combination with a regional dimming technology, a display screen including the Mini-LED backlight module will have a better contrast ratio and a high-dynamic lighting rendering display effect. A micro LED (miniature light-emitting diode) with a size smaller than 80 μm can directly serve as a pixel of a display panel such as a near-to-eye terminal, a wearable terminal, a hand-held terminal and the like.

Figure 2:
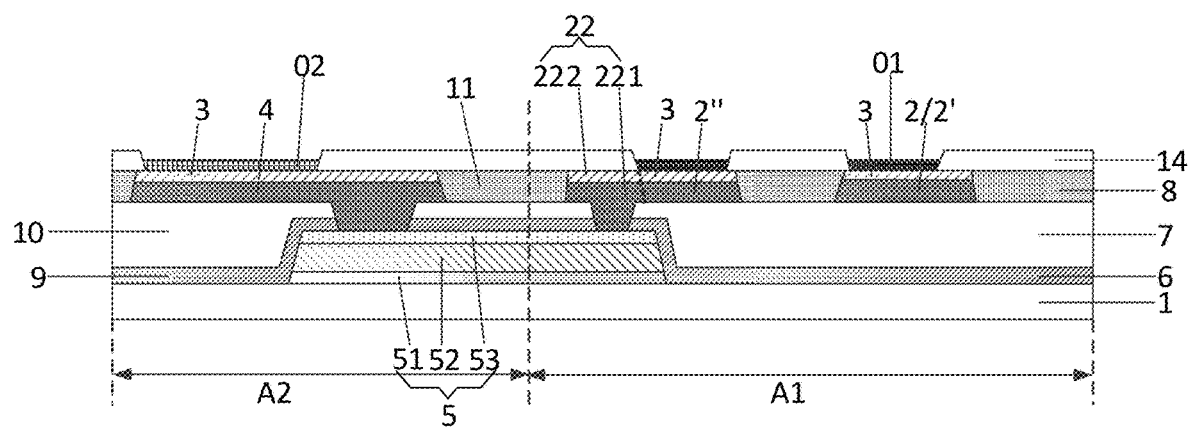
FIG. 2 is a schematic cross-sectional view in a direction AA' of FIG. 4.

In the above array substrate provided by the embodiment of the present disclosure, as shown in FIG. 2, the base substrate 1 includes a functional region A1. The functional region A1 includes a plurality of first pads (2' and 2") located on the base substrate 1, and the plurality of first pads (2' and 2") are configured to be bonded with a plurality of light-emitting units. The light-emitting unit may be a Mini-LED or a microLED. Before the array substrate is bonded with the Mini-LED or the microLED, the conductive layer 2 includes an exposed surface region and a non-exposed surface region, and the exposed surface region in the conductive layer 2 is the first pads (2' and 2").

The array substrate for driving the Mini/Micro LED has a high requirement for electrical resistivity of a metal routing wire, and copper is usually used as a wiring material, correspondingly, the first pads (2' and 2") and the wiring material are made of the same material, that is, the first pads (2' and 2") are made of the copper material. In the relevant art, in order to complete bonding of the Mini/Micro LED and the array substrate, solder paste needs to be arranged on the first pads on the array substrate to be connected with the Mini/Micro LED; then the Mini/Micro LED is transferred to a corresponding position of the array substrate, and then fixing of the Mini/Micro LED and the array substrate is completed in a mode of reflow soldering in a temperature range of 230° C. to 260° C. Bonging a circuit board to the second pads on the array substrate to be electrically connected with the circuit board is realized in a hot-pressing mode in a temperature range of 130° C. to 150° C.

Bonding the Mini/Micro LED and the circuit board to the array substrate needs different process conditions, and bonding of the both cannot be realized synchronously, so when one of the Mini/Micro LED and the circuit board is under bonding, metal at the pads on the array substrate corresponding to the other one is quite susceptible to oxidization. So that subsequent good electrical connection cannot be guaranteed, and consequently a product yield is reduced. Therefore, in the embodiment of the present disclosure, the oxidization protective layer 3 provided by the embodiment of the present disclosure is fabricated on the first pads (2' and 2"), so the first pads (2' and 2") can be prevented from being oxidized, reliability of the first pads (2' and 2") is improved, and the adhesion between the oxidization protective layer 3 and the first pads (2' and 2") is improved.

When the array substrate provided by the embodiment of the present disclosure is bound to the Mini/Micro LED, the array substrate may be a display substrate or a backlight substrate. If the array substrate is the display substrate, a light-emitting region A1 constitutes a display region, a light-emitting unit is a sub-pixel, and thus picture displaying is realized. If the array substrate is the backlight substrate, the light-emitting region A1 is configured to provide a light source so as to cooperate with a passive display panel to realize displaying.

A light-emitting color of the light-emitting region included in the array substrate is not limited here. The light-emitting region may be any one type of a red light-emitting region, a green light-emitting region, or a blue light-emitting region. The array substrate may simultaneously include light-emitting regions of three light-emitting colors, namely, the red light-emitting region, the green light-emitting region, and the blue light-emitting region. Certainly, the array substrate may also include a light-emitting region with only one light-emitting color, for example: include only a plurality of red light-emitting regions, or only a plurality of green light-emitting regions or only a plurality of blue light-emitting regions. Specifically, it can be determined according to actual demands.

A control mode of the plurality of light-emitting regions is not limited, for example, each light-emitting region may be controlled independently, or the plurality of light-emitting regions are controlled at the same time.

During specific implementation, in the above array substrate provided by the embodiment of the present disclosure, as shown in FIG. 2, the base substrate 1 further has a bonding region A2. The bonding region A2 includes a plurality of second pads 4 located on the base substrate 1, and the plurality of second pads 4 are configured to be bonded with the circuit board (not shown in FIG. 2). The second pads 4 and the conductive layer 2 are located on the same film layer; and the oxidization protective layer 3 may be arranged on a side, facing away from the base substrate 1, of the second pads 4. Specifically, the second pads 4 and the conductive layer 2 are located on the same film layer, which means that the both are fabricated by using a single patterning process. The single patterning process means that a needed pattern is formed by one-time film forming and photoetching process. The single patterning process includes processes such as film forming, exposure, developing, etching and stripping. The second pads 4 and the conductive layer 2 are located on the same film layer, so that the number of times of the patterning process can be reduced, a fabrication process is simplified, and production cost is substantially reduced. The above oxidization protective layer 3 is located on the second pads 4, so surfaces of the second pads 4 also have the oxidization resistance, and the adhesion between the second pads 4 and the oxidization protective layer 3 is also high. Therefore, in a fabrication process of the array substrate, the second pads 4 in the bonding region A2 cannot be oxidized, so a problem of oxidization can be avoided in a process of fabricating the array substrate, and stability of the second pads 4 is improved.

During specific implementation, the above array substrate provided by the embodiment of the present disclosure, as shown in FIG. 2, further includes a first routing wire layer 5 located between the first pads (2' and 2") and the base substrate 1; and the first routing wire layer 5 includes a first metal layer 51, a first routing wire sub-layer 52 and a second metal layer 53 which are arranged in a stacked mode. The first pads (2' and 2") and the second pads 4 are electrically connected with different conductive patterns/conductive circuits in the second metal layer 53 respectively.

Materials of the first metal layer 51 and the second metal layer 53 include a molybdenum-niobium alloy, the molybdenum-niobium alloy has the adhesion, and thus the adhesion between the first routing wire layer 5 and the base substrate 1 is enhanced. In some cases, in order to prevent the situation that a whole area of the first routing wire layer 5 is too large, and consequently, the base substrate bears too large stress to be broken, a buffer layer may be arranged between the base substrate 1 and the first routing wire layer 5 so as to relieve the stress. Moreover, the first metal layer 51 of which a material includes the molybdenum-niobium alloy can further enhance the adhesion between the first routing wire layer 5 and the buffer layer, and a material of the buffer layer is, for example, silicon nitride. Meanwhile, the second metal layer 53 of which a material includes the molybdenum-niobium alloy is connected with the first pad 2", and the molybdenum-niobium alloy has the adhesion, so that firm connection between the first routing wire layer 5 and the first pad 2" can be guaranteed. Besides the molybdenum-niobium alloy has electrical conductivity, so that electrical conductivity between the first pad 2" and the first routing wire layer 5 can be guaranteed. A material of the first routing wire sub-layer 52 may include copper, the copper has pretty good electrical conductivity so that electrical connection between film layers can be guaranteed, the copper is small in resistance so that current loss during working can be reduced, and copper is low in price so that fabrication cost of the array substrate can be reduced. Besides, the second metal layer 53 of which a material includes the molybdenum-niobium alloy can protect the copper of the first routing wire sub-layer 52, so the copper is prevented from being oxidized.

During specific implementation, as shown in FIG. 2, the second pad 4 takes a film layer being arranged on the same layer as the conductive layer 2 as an example. Certainly, the second pad 4 may also be only arranged on the same layer as the first routing wire layer 5, or the second pad 4 adopts film layers arranged on the same layer as the first routing wire layer 5 and the conductive layer 2 at the same time.

During specific implementation, in the above array substrate provided by the embodiment of the present disclosure, as shown in FIG. 2, the functional region A1 (a light-emitting region) further includes: a first passivation layer 6 located between the first routing wire layer 5 and the first pads (2' and 2"); a first flat layer 7 located between the first passivation layer 6 and the first pads (2' and 2"); a second flat layer 8 located on a side, facing away from the base substrate 1, of the oxidization protective layer 3; and a first connection portion 01 located on the oxidization protective layer 3. The second flat layer 8 covers a region among the plurality of first pads (2' and 2").

The first routing wire layer 5 may include an anode routing wire 54 and a cathode routing wire 55 (not shown in FIG. 2), that is, both the anode routing wire 54 and the cathode routing wire 55 are arranged by using the first metal layer 51, the first routing wire sub-layer 52 and the second metal layer 53 in a stacked mode. In order to reduce pressure drop (IR Drop), a thickness of the first routing wire sub-layer 52 is greater than a thickness of the conductive layer 2, and the thickness of the first routing wire sub-layer 52 is in positive correlation with a product size of a Mini-LED backplane. The first metal layer 51, the first routing wire sub-layer 52 and the second metal layer 53 may be fabricated in sequence by using a sputtering process; and the second metal layer 53 can protect the first routing wire sub-layer 52 to prevent a surface of the first routing wire sub-layer 52 from being oxidized.

During specific implementation, as shown in FIG. 2, the first passivation layer 6 includes a portion located between the anode routing wire 54 and the cathode routing wire 55 so as to separate adjacent routing wires and avoid mistaken electrical connection between the adjacent routing wires; and a material of the first passivation layer 6 may be silicon nitride, silicon oxide, silicon oxynitride, etc. The first flat layer 7 covers a region between the anode routing wire 54 and the cathode routing wire 55. The first flat layer 7 may be an organic film and configured to fill up a seam region between the routing wires, so as to avoid a large segment gap in a subsequent process and guarantee that a problem of displacement of a light-emitting unit cannot occur during bonding of the light-emitting unit, so that flatness of the array substrate is improved. Meanwhile, the first flat layer 7 may also play a role in insulation.

Figure 3:
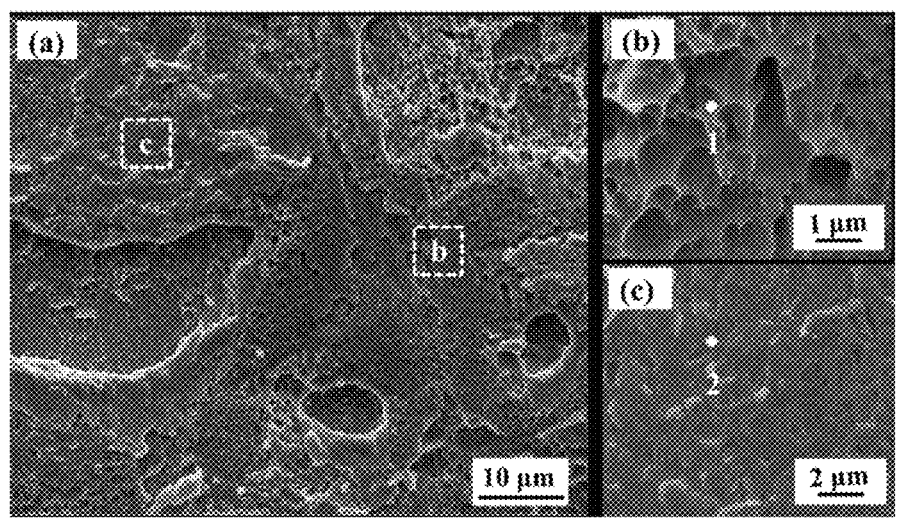
FIG. 3 is an interface diagram of an oxidization protective layer and first pads.

FIG. 3 is an interface diagram of stack metals of the first pads (2' and 2") and the oxidization protective layer 3 in a structure shown in FIG. 2. FIG. 3 takes a test by taking the material of the oxidization protective layer 3 including only W and Ni as an example, where a figure (a) is a scanning electron microscope (SEM) graph of a fracture position at a metal interface of the first pads (2' and 2") and the oxidization protective layer 3, a figure (b) is an enlargement diagram of a position of a dotted line frame region b marked in the figure (a), and a figure (c) is an enlargement diagram of a position of a dotted line frame region c marked in the figure (a). An SEM test result of a fracture position at an interface of the first pads (2' and 2") and the oxidization protective layer 3 is shown in the following Table 1. Metals and an atomic percent (at. %) of a region 1 (corresponding to a region 1 in Table 1) in the figure (b) are shown in a first row of Table 1; and in a phase state Cu (ss, Ni, Fe) of the region 1, ss represents a solid solution alloy state, and a stack metal interface of the first pads (2' and 2") and the oxidization protective layer 3 includes Cu, Fe and Ni, which indicates that the oxidization protective layer 3 including an Ni element is formed on surfaces of the first pads (2' and 2"). Metals and an atomic percent (at. %) of a region 2 (corresponding to a region 2 in Table 1) in the figure (c) are shown in a second row of Table 1; and in a phase state W (ss, Cu, Ni, Fe) in the region 2, ss represents a solid solution alloy state, and the stack metal interface of the first pads (2' and 2") and the oxidization protective layer 3 includes W, Cu, Fe and Ni, which indicates that the oxidization protective layer 3 including elements such as W and Ni is formed on the surfaces of the first pads (2' and 2"). So that the first pads can be protected from being oxidized, stability of the first pads is improved, and the adhesion between the oxidization protective layer 3 and the first pads is improved.

TABLE 1

| | Element Composition (at. %) | | | | | |
|---|---|---|---|---|---|---|
| Region | W | Mo | Cu | Fe | Ni | Phase state |
| 1 | — | — | 74.04 | 1.78 | 24.18 | Cu(ss, Ni, Fe) |
| 2 | 57.60 | — | 19.27 | 8.80 | 14.33 | W(ss, Cu, Ni, Fe) |

During specific implementation, in the above array substrate provided by the embodiment of the present disclosure, as shown in FIG. 2, the bonding region A2 further includes: a second passivation layer 9 located between the first routing wire layer 5 and the second pads 4; a third flat layer 10 located between the second passivation layer 9 and the second pads 4; a fourth flat layer 11 located on a side, facing away from the base substrate 1, of the oxidization protective layer 3; and a second connection portion 02 located on the oxidization protective layer 3.

The fourth flat layer 11 covers a region among the plurality of second pads 4. The third flat layer 10 and the first flat layer 7 are arranged on the same layer, which can form an integrated structure; and materials of the third flat layer 10 and the first flat layer 7 may be an organic material, for example: resin, used for planarization so as to facilitate a subsequent process. The fourth flat layer 11 and the second flat layer 8 are arranged on the same layer, which can form an integrated structure; and materials of the fourth flat layer 11 and the second flat layer 8 may be an organic material, for example: resin, used for planarization so as to facilitate a subsequent process. The second passivation layer 10 and the first passivation layer 6 are arranged on the same layer, which can form an integrated structure; and materials of the second passivation layer 10 and the first passivation layer 6 may be silicon oxynitride, silicon nitride, etc.

Figure 4:
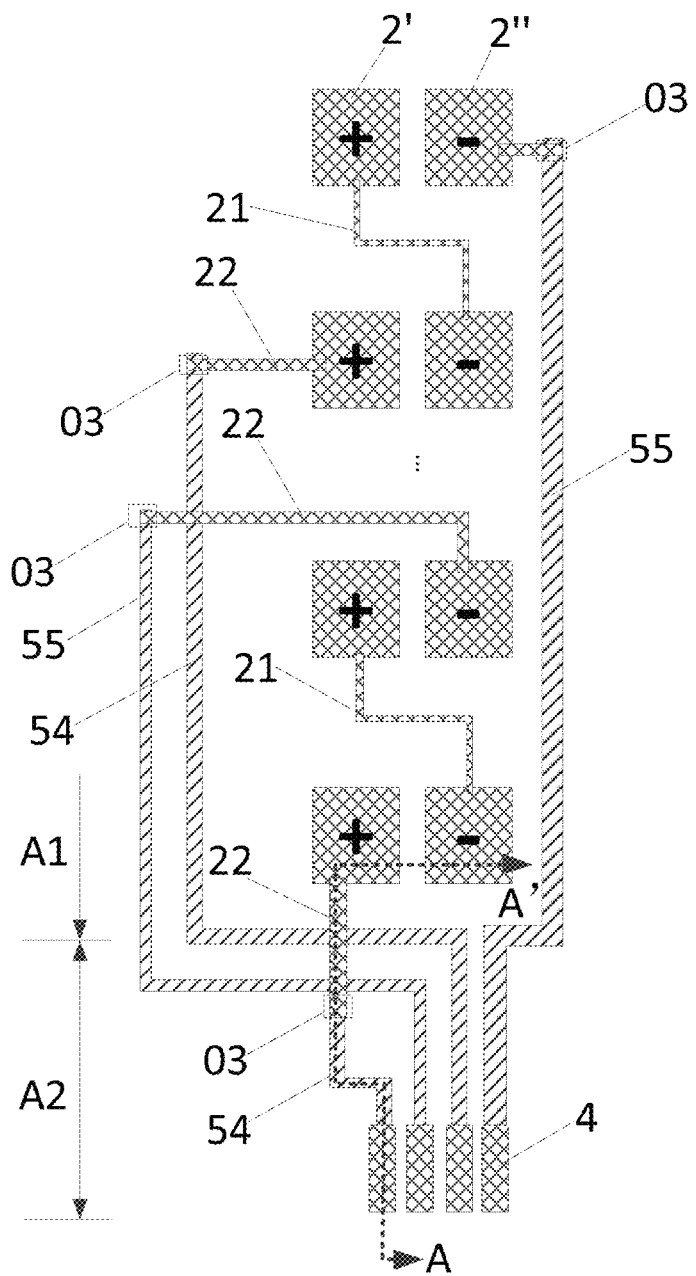
FIG. 4 is a schematic diagram of a partial structure of an array substrate provided by an embodiment of the present disclosure.
Figure 5:
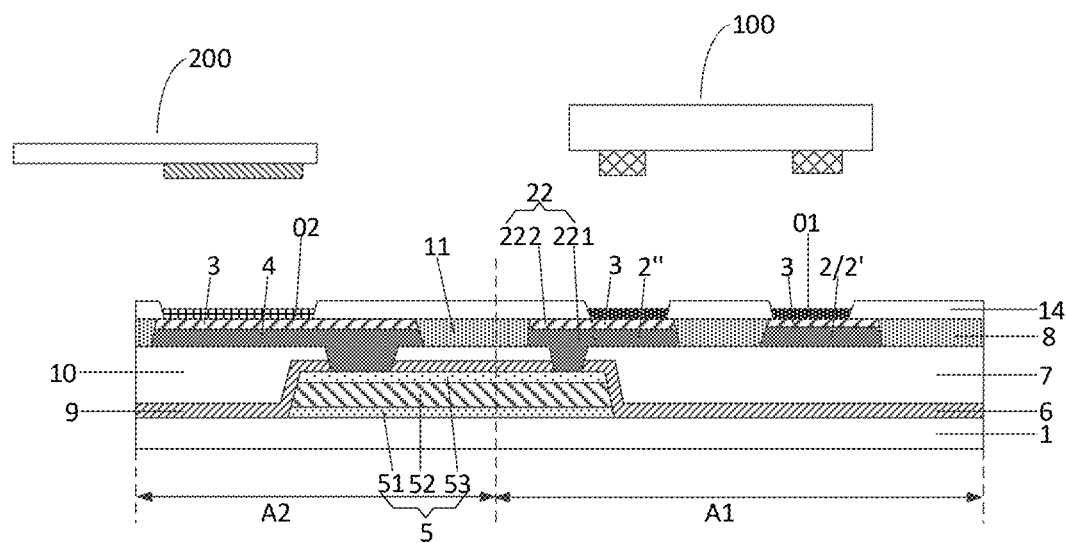
FIG. 5 is another schematic cross-sectional view in a direction AA' of FIG. 4.

During specific implementation, the above array substrate provided by the embodiment of the present disclosure may further include a plurality of light-emitting units, and each light-emitting unit may include a light-emitting diode 100 shown in FIG. 5. It needs to be noted that the light-emitting diode 100 includes an anode and a cathode, so bonding of one light-emitting diode 100 needs to be completed through two first pads. The above plurality of first pads may be divided into a plurality of first pad groups, each first pad group is configured to bond one light-emitting diode and includes a cathode pad and an anode pad arranged pairwise, the first pad bound to the cathode of the light-emitting diode is called the cathode pad, and the first pad bound to the anode of the light-emitting diode is called the anode pad. As shown in FIG. 4, each first pad group includes the cathode pad 2" and the anode pad 2' arranged pairwise, and structures of film layers included in the cathode pad 2" and the anode pad 2' are the same.

The light-emitting diode 100 is bound to the cathode pad and the anode pad through the first connection portion 01 (solder paste or copper paste). The solder paste and the copper paste generally contain Ni, so the above oxidization protective layer 3 provided by the embodiment of the present disclosure may select a W/Ni alloy and a W/Ni/Cu alloy preferably. Ni in the oxidization protective layer 3 may be combined with Ni in the solder paste, and the adhesion between the first connection portion 01 and the oxidization protective layer 3 is improved.

A circuit board 200 is bonded with the second pads through the second connection portion 02, specifically, the circuit board 200 includes a printer circuit board, a flexible circuit board, an integrated circuit chip, etc. A material of the second connection portion 02 may be a thermo-curing adhesive or an anisotropic conductive adhesive.

During specific implementation, in the above array substrate provided by the embodiment of the present disclosure, as shown in FIG. 2 and FIG. 4, FIG. 2 is a schematic cross-sectional view in a direction AA' in FIG. 4, the plurality of first pads are divided into the plurality of first pad groups, and each first pad group includes the cathode pad 2" and the anode pad 2' arranged pairwise. The non-exposed surface region (namely a region not in direct contact with the light-emitting units) in the conductive layer 2 is configured to realize series connection or parallel connection of the plurality of first pad groups and further configured to be electrically connected with the first routing wire layer 5 through a via hole 03 penetrating through the first flat layer 7 and the first passivation layer 6. That is, the non-exposed surface region in the conductive layer 2 includes a routing wire 21 and a routing wire 22, the routing wire 22 is composed of a third metal layer 221 and a fourth metal layer 222, the third metal layer 221 and the first pad 2" are an integrated structure, and the fourth metal layer 222 and the oxidization protective layer 3 are an integrated structure, which is separated by a dotted line in FIG. 2.

Certainly, during specific implementation, the routing wire 22 may be arranged to include only the third metal layer 221, that is, the routing wire 22 does not include the fourth metal layer 222 in FIG. 2.

A specific connection mode of the above plurality of first pad groups is not limited. FIG. 4 makes illustration by taking the two adjacent first pad groups being in series connection as an example. As shown in FIG. 2 and FIG. 4, the region A2 is the bonding region, the region A1 is the functional region (emitting light region), the plurality of first pads (2' and 2") may be divided into a plurality of first pad groups, each first pad group is configured to bond one light-emitting diode and includes the cathode pad 2" and the anode pad 2' arranged pairwise. The first routing wire layer 5 may include the anode routing wire 54 and the cathode routing wire 55. The two adjacent first pad groups are in series connection through the routing wire 21. As shown in FIG. 2 and FIG. 3, in the two first pad groups connected in series, the anode pad 2" of one group is connected with one routing wire 22, the routing wire 22 is electrically connected with the anode routing wire 54 through a via hole 03 penetrating through the first passivation layer 6 and the first flat layer 7, and the anode routing wire 54 is electrically connected with one second pad 4 through a via hole (not shown in FIG. 2) penetrating through the first passivation layer 6 and the first flat layer 7; and the cathode pad of the other group is connected with another routing wire 22, the routing wire 22 is electrically connected with the cathode routing wire 55 through another via hole 03 penetrating through the first passivation layer 6 and the first flat layer 7, and the cathode routing wire 55 is electrically connected with another second pad 4 through a via hole (not shown in FIG. 2) penetrating through the first passivation layer 6 and the first flat layer 7. In FIG. 4, the cathode pad 2", the anode pad 2', the second pad 4, the routing wire 21 and the routing wire 22 are arranged on the same layer; the cathode pad 2", the anode pad 2', the second pad 4, the routing wire 21 and the routing wire 22 are illustrated by using the same filled pattern; the anode routing wire 54 and the cathode routing wire 55 are arranged on the same layer; and the anode routing wire 54 and the cathode routing wire 55 are illustrated by using the same filled pattern.

It can be understood that a driving mode of the array substrate is not limited by the present disclosure, as shown in FIG. 4, the array substrate adopts a passive mode to drive the light-emitting unit, or may also provide a signal for the light-emitting unit through a driving circuit including a thin-film transistor, or may also provide a signal for the light-emitting unit through a microchip.

Specifically, when the signal is provided for the light-emitting unit through the microchip, each microchip includes a plurality of pins, the array substrate further includes a third pad located in the light-emitting region, and a structure of the third pad is similar to a structure of the first pad and can be fabricated by using the same film layer structure as the first pad. The plurality of light-emitting units may be divided into a plurality of lamp regions, each lamp region includes at least one light-emitting unit, and each microchip is configured to drive the light-emitting unit of at least one lamp region to emit light.

During specific implementation, the above array substrate provided by the embodiment of the present disclosure, as shown in FIG. 2 and FIG. 5, further includes a protective layer 14 located on a side, facing away from the base substrate 1, of the first pads (2' and 2") and the second pad 4; the protective layer 14 is exposed out of the first pads (2' and 2") and the second pad 4; and a material of the protective layer 14 may include silicon nitride or silicon oxide.

During specific implementation, in the above array substrate provided by the embodiment of the present disclosure, the light-emitting unit may be a mini light emitting diode (MiniLED for short), or called a submillimeter light-emitting diode, or a micro light-emitting diode (Micro LED for short).

When the array substrate provided by the embodiment of the present disclosure shown in FIG. 2 is used as a backlight source, Mini LED backlight realizes a backlight effect by using a large quantity of ultra-small-sized LED lamp sets, and a size and pitch of the Mini LED are small. Therefore, the Mini LED backlight can not only make local dimming zones more delicate to reach a high-dynamic range (HDR) and display a high-contrast ratio effect, but also shorten an optical distance (OD) so as to reduce a thickness of a whole machine to meet a demand of getting thinner. The Micro LED is a new-generation display technology and is an LED miniature and matrix technology, and the Micro LED is smaller in size than the Mini LED, that is, can further increase local dimming zones and improve a contrast ratio of a liquid crystal display.

The thin-film transistor (TFT) has a quite important function in working performance of a display device, a pixel circuit with a specific driving component is formed by designing a connection relation of a plurality of thin-film transistors, the pixel circuit can provide an electrical signal for the light-emitting unit (the Micro LED, Mini LED, an organic light-emitting diode (OLED), a quantum dot light emitting diode (QLED), etc.)

Figure 6:
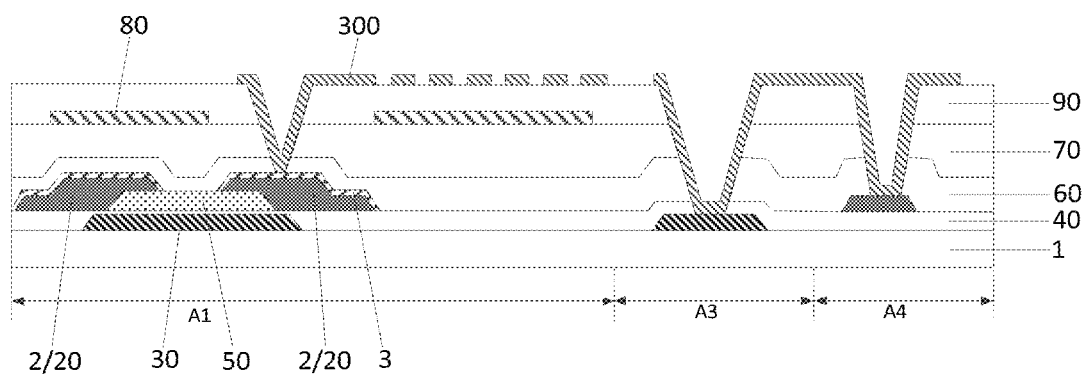
FIG. 6 is a schematic structural diagram of another array substrate provided by an embodiment of the present disclosure.

The TFT mainly includes a gate, an active layer and a source-drain electrode; and for a TFT process, the source-drain electrode may generally be formed by using two processes, i.e., dry etching and wet etching. When the wet etching process is adopted, the source-drain electrode is fabricated generally by using the Cu material; and in a subsequent fabrication process, the source-drain electrode needs to be exposed so as to be electrically connected with a pixel electrode. In order to prevent Cu from being oxidized, Mo is used as a buffer material on Cu in the prior art, however, Mo is also susceptible to oxidization and poor in adhesion to other film layers. Therefore, in the above array substrate provided by the embodiment of the present disclosure, as shown in FIG. 6, FIG. 6 takes the array substrate of an LCD device as an example, the base substrate 1 includes the functional region A1 (the light-emitting region), the functional region A1 includes the thin-film transistor located on the base substrate 1, the thin-film transistor includes a source-drain electrode layer 20, and the source-drain electrode layer 20 and the conductive layer 2 shown in FIG. 1 are arranged on the same layer and made of the same material. The oxidization protective layer 3 provided above is fabricated on the source-drain electrode layer 20 in the embodiment of the present disclosure, so that the source-drain electrode layer 20 can be prevented from being oxidized, and the adhesion between the oxidization protective layer 3 and the source-drain electrode layer 20 is improved.

During specific implementation, the above array substrate provided by the embodiment of the present disclosure, as shown in FIG. 6, further includes: a gate layer 30, a gate insulation layer 40 and the active layer 50 arranged between the base substrate 1 and the source-drain electrode layer 20 in a stacked mode; and a third passivation layer 60, a fifth flat layer 70, a common electrode 80, a fourth passivation layer 90 and a driving electrode 300 arranged on the side, facing away from the base substrate 1, of the oxidization protective layer 3 in a stacked mode in sequence. The driving electrode 300 is electrically connected with the oxidization protective layer 3 through a via hole sequentially penetrating through the fourth passivation layer 90, the fifth flat layer 70 and the third passivation layer 60; and the driving electrode is configured to be electrically connected with the light-emitting unit so as to provide a driving signal for the light-emitting unit.

During specific implementation, as shown in FIG. 6, the base substrate 1 further has a non-luminous region, and the non-luminous region generally includes a gate on array (GOA) region A3 and the bonding region A4. A difference between the TFT substrate shown in FIG. 6 of the embodiment of the present disclosure and a TFT substrate in the prior art is that the oxidization protective layer 3 is fabricated on the source-drain electrode layer 20, and other film layers are the same as the prior art, which is not detailed herein.

At present, an existing preparation flow of a TFT and a mini-LED is relatively mature, the solution of present disclosure adopts an existing process and device and effectively improves properties of a device without adding devices based on the prior art. Besides, the solution of present disclosure makes improvement based on the prior art, an existing production line may be adjusted correspondingly, and mass production is quite large.

Based on the same inventive concept, an embodiment of the present disclosure further provides a display apparatus, including the above array substrate provided by the embodiments of the present disclosure.

The display apparatus is characterized by being high in contrast ratio, good in brightness, high in color rendition degree and the like. The display apparatus may be a rigid display apparatus, or may be a flexible display apparatus (that is, bendable and foldable). The display apparatus may be: a mobile phone, a tablet computer, a TV, a display, a notebook computer, a digital photo frame, a navigator and any product or part with a display function. Other necessary components of the display apparatus should be understood by those ordinarily skilled in the art, which is neither repeated herein nor used as a limitation on the present disclosure. A principle of solving problems of the display apparatus is similar to the above array substrate, so implementation of the display apparatus may refer to implementation of the above array substrate, and repetitions are omitted herein.

In the array substrate and the display apparatus provided by the embodiments of the present disclosure, after preparation of the conductive layer with the Cu material is completed, the oxidization protective layer of which a material includes the tungsten (W) is directly prepared on the conductive layer, and W has the oxidization resistance, so the oxidization protective layer can play a role in protecting the conductive layer. Moreover, a thermal diffusivity of W is greater than that of Cu, W may be diffused towards Cu to form a W/Cu interface, and the adhesion of the oxidization protective layer and the conductive layer can be improved under the condition of guaranteeing the film forming uniformity. Therefore, the array substrate provided by the embodiments of the present disclosure can improve the stability of the conductive layer and improve the adhesion of the oxidization protective layer and the conductive layer so as to improve the reliability of the product.

Apparently, those skilled in the art can make various modifications and transformations to the present disclosure without departing from the spirit and scope of the present disclosure. In this case, if these modifications and transformations of the present disclosure fall within the scope of the claims and their equivalents of the present disclosure, the present disclosure also intends to contain these modifications and transformations.

What is claimed is:

1. An array substrate, comprising:
a base substrate;
a conductive layer, arranged on the base substrate, wherein a material of the conductive layer comprises copper; and
an oxidization protective layer, arranged on a side, facing away from the base substrate, of the conductive layer; wherein a material of the oxidization protective layer comprises tungsten;
wherein the base substrate comprises a functional region; the functional region comprises a plurality of first pads arranged on the base substrate; the plurality of first pads are bonded with a plurality of light-emitting units; the conductive layer comprises an first region and a second region; and the first region in the conductive layer is the plurality of first pads;
wherein the base substrate further comprises a bonding region; the bonding region comprises a plurality of second pads arranged on the base substrate; the plurality of second pads are bonded with a circuit board; the second pads and the conductive layer are arranged on a same film layer; and the oxidization protective layer is arranged on a side, facing away from the base substrate, of the plurality of second pads;
wherein the array substrate further comprises a first routing wire layer arranged between the plurality of first pads and the base substrate;
the first routing wire layer comprises a first metal layer, a first routing wire sub-layer and a second metal layer which are arranged in a stacked mode;
the plurality of first pads are electrically connected with the second metal layer, and the plurality of second pads are electrically connected with the second metal layer; and
materials of the first metal layer and the second metal layer comprise a molybdenum-niobium alloy, and a material of the first routing wire sub-layer comprises copper.

2. The array substrate according to claim 1, wherein the material of the oxidization protective layer further comprises nickel.

3. The array substrate according to claim 2, wherein the material of the oxidization protective layer further comprises copper.

4. The array substrate according to claim 2, wherein the material of the oxidization protective layer further comprises at least one type of other metal materials of which a lattice constant has a difference between 0.1 and 0.6 from a lattice constant of the copper.

5. The array substrate according to claim 4, wherein a crystal form of each of the other metal materials is face-centered cubic or body-centered cubic; and
a thermal diffusivity of each of the other metal materials is greater than a thermal diffusivity of the copper.

6. The array substrate according to claim 5, wherein the other metal materials comprise titanium, molybdenum or aluminum.

7. The array substrate according to claim 4, wherein a thickness of the oxidization protective layer ranges from 30 nm to 150 nm.

8. The array substrate according to claim 1, wherein the functional region further comprises:
- a first passivation layer arranged between the first routing wire layer and the plurality of first pads;
- a first flat layer arranged between the first passivation layer and the plurality of first pads;
- a second flat layer arranged on a side surface of the oxidization protective layer; and
- a first connection portion arranged on the oxidization protective layer;
- wherein the second flat layer covers a region among the plurality of first pads.

9. The array substrate according to claim 8, wherein the bonding region further comprises:
- a second passivation layer arranged between the first routing wire layer and the plurality of second pads;
- a third flat layer arranged between the second passivation layer and the plurality of second pads;
- a fourth flat layer arranged on a side surface of the oxidization protective layer; and
- a second connection portion arranged on the oxidization protective layer;
- wherein the fourth flat layer covers a region among the plurality of second pads; and
- the third flat layer and the first flat layer are arranged on a same layer, the fourth flat layer and the second flat layer are arranged on a same layer, and the second passivation layer and the first passivation layer are arranged on a same layer.

10. The array substrate according to claim 8, wherein the plurality of first pads are divided into a plurality of first pad groups, and each of the plurality of first pad groups comprises a cathode pad and an anode pad which are arranged pairwise; and
- the second region in the conductive layer is configured to realize series connection or parallel connection of the plurality of first pad groups and further configured to be electrically connected with the first routing wire layer through a via hole penetrating through the first flat layer and the first passivation layer.

11. The array substrate according to claim 1, further comprising a protective layer arranged on a side, facing away from the base substrate, of the plurality of first pads and the plurality of second pads;
- wherein the protective layer is exposed out of the plurality of first pads and the plurality of second pads; and
- a material of the protective layer comprises silicon nitride or silicon oxide.

12. The array substrate according to claim 1, wherein
- the functional region comprises a thin-film transistor arranged on the base substrate;
- the thin-film transistor comprises a source-drain electrode layer; and
- the source-drain electrode layer and the conductive layer are arranged on a same layer and made of a same material.

13. A display apparatus, comprising: the array substrate according to claim 1.

* * * * *